(12) United States Patent
Vashchenko et al.

(10) Patent No.: US 7,639,464 B1
(45) Date of Patent: Dec. 29, 2009

(54) HIGH HOLDING VOLTAGE DUAL DIRECTION ESD CLAMP

(75) Inventors: Vladislav Vashchenko, Palo Alto, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 9 days.

(21) Appl. No.: 11/376,492

(22) Filed: Mar. 15, 2006

(51) Int. Cl.
*H02H 9/00* (2006.01)
*H02H 3/20* (2006.01)

(52) U.S. Cl. ..................... 361/56; 361/91.5
(58) Field of Classification Search .......... 361/56, 361/91.5
See application file for complete search history.

(56) References Cited

U.S. PATENT DOCUMENTS

| | | | | |
|---|---|---|---|---|
| 5,192,920 A | * | 3/1993 | Nelson et al. ............ 330/277 |
| 5,382,819 A | * | 1/1995 | Honjo .................... 257/371 |
| 6,548,868 B1 | * | 4/2003 | Tsuei et al. .............. 257/355 |
| 6,822,296 B2 | * | 11/2004 | Wang .................... 257/355 |
| 7,180,133 B1 | * | 2/2007 | Vashchenko et al. ....... 257/343 |
| 2002/0181177 A1 | * | 12/2002 | Ker et al. ................ 361/56 |
| 2006/0043487 A1 | * | 3/2006 | Pauletti et al. ........... 257/355 |
| 2006/0065932 A1 | * | 3/2006 | Huang et al. ............. 257/355 |
| 2007/0146564 A1 | * | 6/2007 | Wu et al. ................. 349/40 |

* cited by examiner

*Primary Examiner*—Fritz M. Fleming
*Assistant Examiner*—Lucy Thomas
(74) *Attorney, Agent, or Firm*—Jurgen K. Vollrath

(57) ABSTRACT

In a dual direction ESD protection structure, first and second NMOS devices are serially connected back-to-back by connecting their drains or their sources using a common floating interconnect, while ensuring that the devices remain isolated from each other.

6 Claims, 2 Drawing Sheets

HIGH HOLDING VOLTAGE DUAL DIRECTION ESD CLAMP

FIELD OF THE INVENTION

The invention relates to ESD devices. In particular it relates to dual direction ESD clamp.

BACKGROUND OF THE INVENTION

In designing ESD clamps two important parameters to consider are the triggering voltage at which the ESD clamp triggers, and the holding voltage, which defines the voltage below which the clamp no longer conducts after an ESD event and thus avoids latch up. The present invention seeks to provide a clamp based on NMOS devices which inherently have high holding voltage characteristics and which thus make the clamp resistant to latch-up.

Furthermore, many applications, such as amplifiers, interface products, display column drivers, level shifters, and automotive applications require ESD protection in both directions to protect against both positive and negative ESD pulses. The present invention seeks to provide a dual direction ESD clamp.

Also, many of the ESD protection solutions that have been developed in the past have relied on SCR devices. However, these require the implementation of a non-self-aligned device architecture, which complicates the implementation of a system level protection.

SUMMARY OF THE INVENTION

According to the invention, there is provided a high voltage, dual direction ESD clamp comprising a first NMOS device and a second NMOS device formed back-to-back and isolated from each other. The first and second NMOS devices may share an interconnect that interconnects either the drain regions of the devices or the source regions of the devices. Preferably the interconnect is implemented as a floating interconnect. Typically the source and bulk regions of each of the two devices are connected together, thus interconnecting the sources of the two devices results in the sources and bulks of the devices to be interconnected. In the case of an embodiment in which the drains of the two devices are interconnected, the source, gate and bulk of each device may be each be separately interconnected. The effect of a back-to-back connection of two NMOS devices is that there is a serial connection of the body diode of the one device and the snapback NMOS with parasitic NPN of the other device.

DETAILED DESCRIPTION OF THE INVENTION

Figure 1:
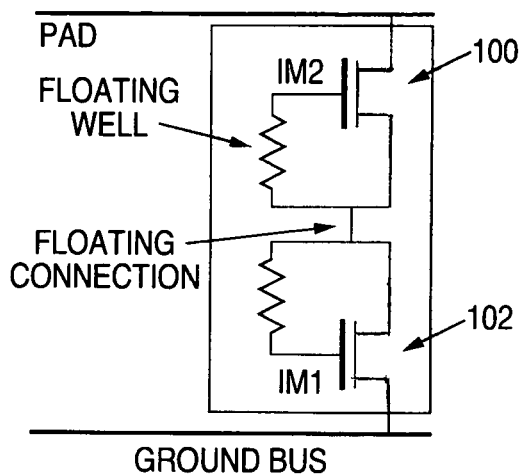
FIG. 1 shows a schematic diagram of one embodiment of a back-to-back arrangement of the invention.
Figure 2:
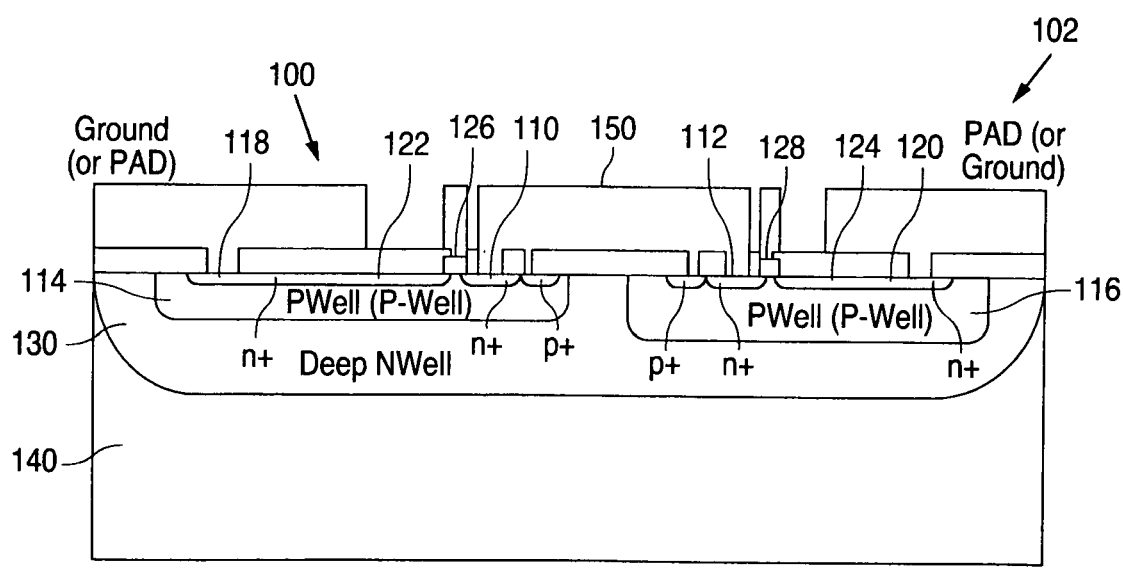
FIG. 2 shows a cross section through an embodiment of the FIG. 1 arrangement.

One embodiment of a dual direction ESD clamp is shown in FIGS. 1 and 2. FIG. 1 shows a schematic circuit diagram of two NMOS devices connected in series with their sources interconnected. As shown in the cross-section of FIG. 2, the first NMOS device 100 and second NMOS device are interconnected by having a common floating interconnect 150 that interconnects the source 110 of NMOS 100 and source 112 of NMOS 102. Also, the bulk 114 of NMOS 100, which takes the form of a p-well (RWELL), is connected to the source 110. Similarly the bulk 116 of NMOS 102, which also takes the form of a p-well (RWELL), is connected to the source 112. Thus, in effect the sources 110, 112 and bulks 114, 116 are all interconnected by the common floating interconnect 150.

Nevertheless, the devices 100, 102 are isolated from each other by a deep n-well 130 that extends around the p-well (RWELL) of each device as shown in FIG. 2. The deep n-well 130 is, in turn, formed in a p-substrate 140. The two NMOS devices 100, 102 otherwise are implemented as standard snapback devices, with their drains 118, 120 having ballast regions 122, 124, respectively. The gates 1126, 128 for the devices 100, 102, respectively, are also formed in a conventional manner. It will be appreciated that by making use of simple self-aligned NMOS structures the process is significantly simplified over non-self-aligned structures such as SCR devices. Also the use of NMOS devices in achieving the dual direction clamp inherently provides for a high holding voltage clamp due to the high holding voltage characteristics of NMOS devices.

Figure 3:
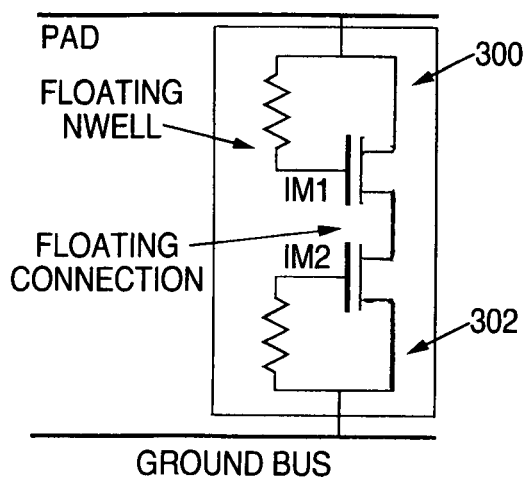
FIG. 3 shows a schematic circuit diagram of another embodiment of a back-to-back arrangement of the invention.
Figure 4:
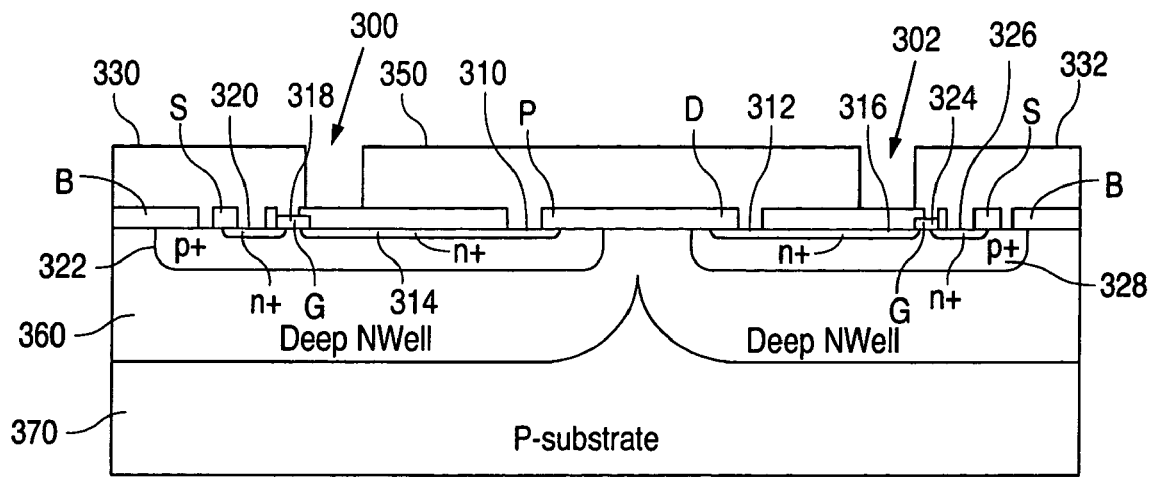
FIG. 4 shows a cross section through an embodiment of the FIG. 3 arrangement.

Another embodiment of the invention is shown in FIGS. 3 and 4. FIG. 3 shows a schematic diagram of a pair of NMOS devices connected serially back-to-back with their drains interconnected. This is best shown in the cross-sectional view of FIG. 4. In this embodiment the drain 310 of device 300 with its ballast region 314 is connected to the drain 312 with its ballast region 316 by means of a common floating interconnect 350. For device 300 the gate 318, source 320, and ballast 322 are connected together by means of a common interconnect 330. Similarly, for device 302, the gate 324, source 326, and bulk 328 are interconnected by a common interconnect 332. As shown in FIG. 4, the bulk of device 300 takes the form of a p-well (RWELL) 322 and the bulk of device 302 takes the form of a p-well (RWELL) 328. Again the two NMOS devices 300, 302 are isolated from each other. In particular, a deep n-well 360 extends around each NMOS device as shown in FIG. 4. The deep n-well 360 is, in turn, formed in a p-substrate 370.

It will be appreciated that the effect of a back-to-back connection of two NMOS devices as discussed above is that there is a serial connection of the body diode of the one device and the snapback NMOS with parasitic NPN of the other device, thereby providing a high voltage, dual direction ESD protection structure.

Figure 5:
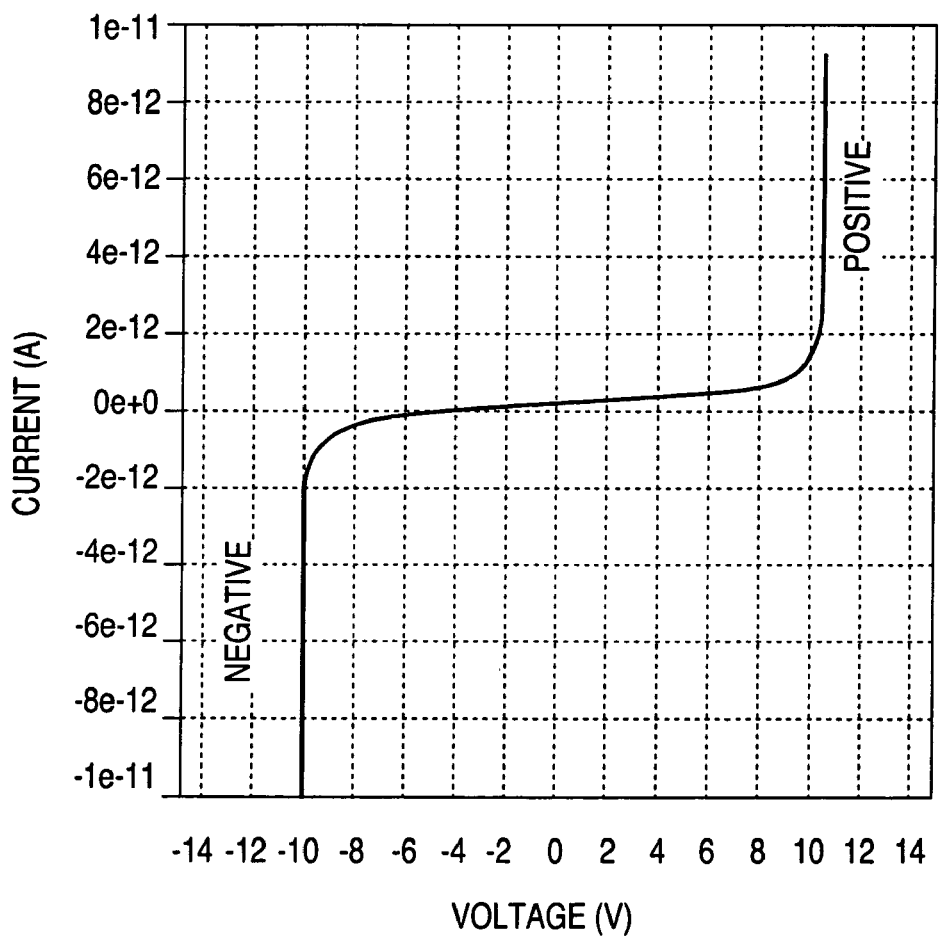
FIG. 5 is an I-V curve for an embodiment such as that illustrated in FIG. 2.

TCAD simulations of an embodiment as shown in FIGS. 1 and 2 confirm the dual direction protection capabilities of the back-to-back NMOS arrangement. In particular, FIG. 5 shows current versus voltage curves for both positive and negative ESD pulse conditions.

What is claimed is:
1. A dual direction ESD clamp, comprising
   a first source-bulk connected NMOS device and
   a second source-bulk connected NMOS device, wherein the first and second NMOS devices are formed back-to-back with their sources or their drains interconnected, the NMOS devices being isolated from each other by having the drain and source of each NMOS device formed in a separate p-well, the p-wells in turn being formed in a deep n-well.

2. A clamp of claim 1, wherein the first and second NMOS devices are interconnected by means of a common floating interconnect.

3. A clamp of claim 1, wherein each NMOS device includes a source and a bulk region that are connected together by a common interconnect.

4. A clamp of claim 2, wherein the drains of the first and second NMOS devices are interconnected by a first interconnect, and wherein the first NMOS device includes a first source, and a first bulk connected by a second interconnect, and the second NMOS device includes a second source and a second bulk connected together by a third interconnect.

5. A clamp of claim 1, wherein the deep n-well is formed in a p-substrate.

6. A clamp of claim 2, wherein the sources of the first and second NMOS devices are interconnected by said common floating interconnect, and each NMOS device further includes a bulk connection, the bulk connections also being interconnected by the common floating interconnect.

* * * * *